United States Patent
Chan et al.

(10) Patent No.: US 8,969,152 B2
(45) Date of Patent: Mar. 3, 2015

(54) FIELD-EFFECT TRANSISTOR (FET) WITH SOURCE-DRAIN CONTACT OVER GATE SPACER

(71) Applicant: International Business Machines Corporation, Armonk, NY (US)

(72) Inventors: Kevin K. Chan, Staten Island, NY (US); Wilfried E. Haensch, Somers, NY (US); Effendi Leobandung, Stormville, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/920,044

(22) Filed: Jun. 17, 2013

(65) Prior Publication Data

US 2014/0370681 A1    Dec. 18, 2014

(51) Int. Cl.
*H01L 21/8242*    (2006.01)
*H01L 29/66*    (2006.01)

(52) U.S. Cl.
CPC ................... *H01L 29/66575* (2013.01)
USPC ........... 438/253; 438/128; 438/133; 438/202; 438/300

(58) Field of Classification Search
None
See application file for complete search history.

(56) References Cited

U.S. PATENT DOCUMENTS 7,417,286 B2 *  8/2008  Kim et al. ............... 257/353
2005/0248035 A1 * 11/2005  Son et al. ................ 257/758

* cited by examiner

*Primary Examiner* — Kyoung Lee
(74) *Attorney, Agent, or Firm* — Ido Tuchman; Louis J. Percello

(57) ABSTRACT

A field-effect transistor (FET) and methods for fabricating such. The FET includes a substrate having a crystalline orientation, a source region in the substrate, and a drain region in the substrate. Gate spacers are positioned over the source region and the drain region. The gate spacers include a gate spacer height. A source contact physically and electrically contacts the source region and extends beyond the gate spacer height. A drain contact physically and electrically contacts the drain region and extends beyond the gate spacer height. The source and drain contacts have the same crystalline orientation as the substrate.

17 Claims, 8 Drawing Sheets

FIELD-EFFECT TRANSISTOR (FET) WITH SOURCE-DRAIN CONTACT OVER GATE SPACER

BACKGROUND

The present invention relates to transistor design, and more particularly, to a novel field-effect transistor (FET) design.

FETs are a type of transistor that have source, drain, and gate terminals. Typically, integrated circuits include many FETs on a single substrate. As circuits become miniaturized, the size of FETs become smaller and smaller. Smaller FETs tend to have higher parasitic contact resistance due to a smaller contact area in the source-drain region. The parasitic contact resistance can dominate circuit delay during the circuit's operation.

BRIEF SUMMARY

Accordingly, one example aspect of the present invention is a method for constructing a field-effect transistor (FET). The method includes forming a source region and a drain region in a substrate. Next, gate spacers are formed over the source region and the drain region. The gate spacers include a gate spacer height. A growing step epitaxially grows a source contact and a drain contact. The source contact contacts the source region and extends beyond the gate spacer height. The drain contact contacts the drain region and extends beyond the gate spacer height.

Another example aspect of the present invention is a field-effect transistor (FET). The FET includes a substrate having a crystalline orientation, a source region in the substrate, and a drain region in the substrate. Gate spacers are positioned over the source region and the drain region. The gate spacers include a gate spacer height. A source contact physically and electrically contacts the source region and extends beyond the gate spacer height. The source contact has the same crystalline orientation as the substrate. A drain contact physically and electrically contacts the drain region and extends beyond the gate spacer height. The drain contact also has the same crystalline orientation as the substrate.

A further example aspect of the present invention is transistor array. The transistor array includes a substrate having a crystalline orientation and a plurality of field-effect transistors (FETs). Each FET includes source and drain regions in the substrate. Gate spacers are positioned over the source and drain regions at a gate spacer height. A first contact physically and electrically contacts the source region of a first FET and the drain region of a second FET. A second contact physically and electrically contacts the drain region of the first FET and the source region of a third FET. The first and second contacts extend beyond the gate spacer height and have the same crystalline orientation as the substrate.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
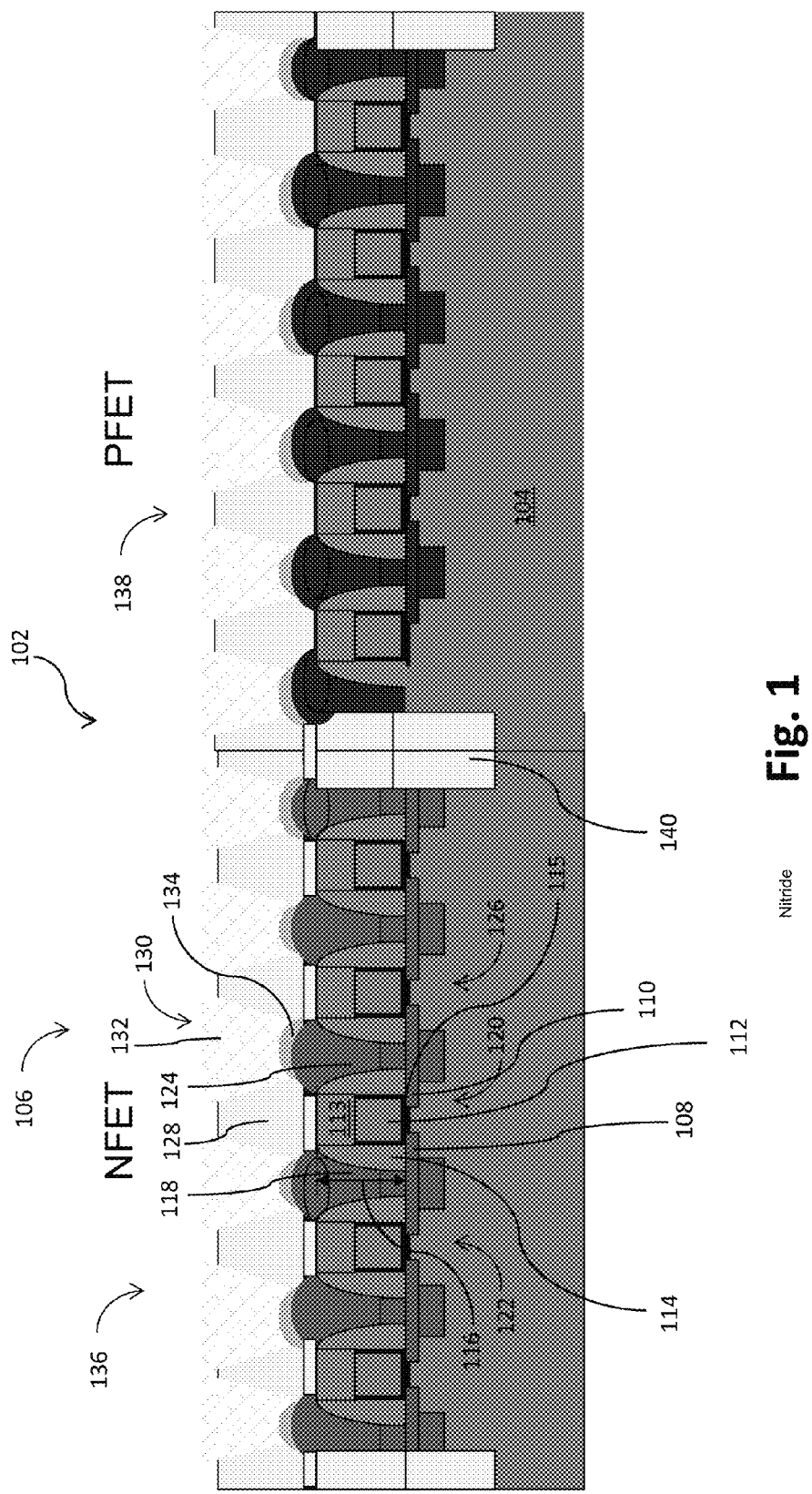
FIG. 1 shows an example an example transistor array contemplated by the present invention.

The present invention is described with reference to embodiments of the invention. Throughout the description of the invention reference is made to FIGS. 1-7. When referring to the figures, like structures and elements shown throughout are indicated with like reference numerals.

Embodiments of the present invention include a design of the base region of a CMOS transistor, resulting in significantly larger drain current than the drain current in conventional CMOS transistors. Specifically, the novel high-current device is a lateral CMOS transistor.

FIG. 1 illustrates an example transistor array 102 contemplated by the present invention. The transistor array 102 includes a substrate 104 having a crystalline orientation. For instance, the substrate 104 may have a crystalline orientation of [100], [111] or [110].

The transistor array 102 further includes a plurality of field-effect transistors (FETs) 106. In a particular embodiment, the FETs are metal-oxide-semiconductor field-effect transistors (MOSFETs).

Each transistor 106 includes a source region 108 and a drain region 110 in the substrate 104. The transistors 106 further include an electrically conductive metal gate 112 above and intermediate to the source region 108 and the drain region 110. The gate 112 includes a metal gate high-k dielectric 115. Above the gate 112 is a nitride hard mask 113 that protects the gate 112 during the fabrication process. Gate spacers 114 are positioned over the source region 108 and drain region 108. The gate spacers include a gate spacer height 116. In one embodiment, the gate spacer is a nitride spacer.

The transistor array 102 further includes a first contact 118 physically and electrically contacting the source region 108 of a first FET 120 and the drain region 110 of a second FET 122. The first contact 118 extends beyond the gate spacer height 116 and has the same crystalline orientation as the substrate 104.

Similarly, a second contact 124 physically and electrically contacts the drain region 110 of the first FET 120 and the source region 108 of a third FET 126. The second contact 124 extends beyond the gate spacer height 116 and has the same crystalline orientation as the substrate 104.

A dielectric layer 128 is positioned over the conductive gate 112. The dielectric layer 128 defines a plurality of vias 130 directly above the first contact 118 and the second contact 124. In one embodiment, the dielectric layer is an oxide layer. The vias 130 are filled with a conductive material 132, such as tungsten, and a metal silicide 134 at the top contract area.

In a particular embodiment, the substrate 104 includes an array of NFETs 136 and PFETs 138. The NFETs 136 may be doped, for example, with a phosphorous dopant in the source regions 108 and drain regions 110, as well as in the first contacts 118 and second contacts 124. The PFETs 138 may be doped, for example, with a boron dopant in the source regions 114 and drain regions 110, as well as in the first contacts 118 and second contacts 124. The NFETs 136 and PFETs 138 may be separated by a shallow trench isolation (STI) region 140.

Figure 2A:
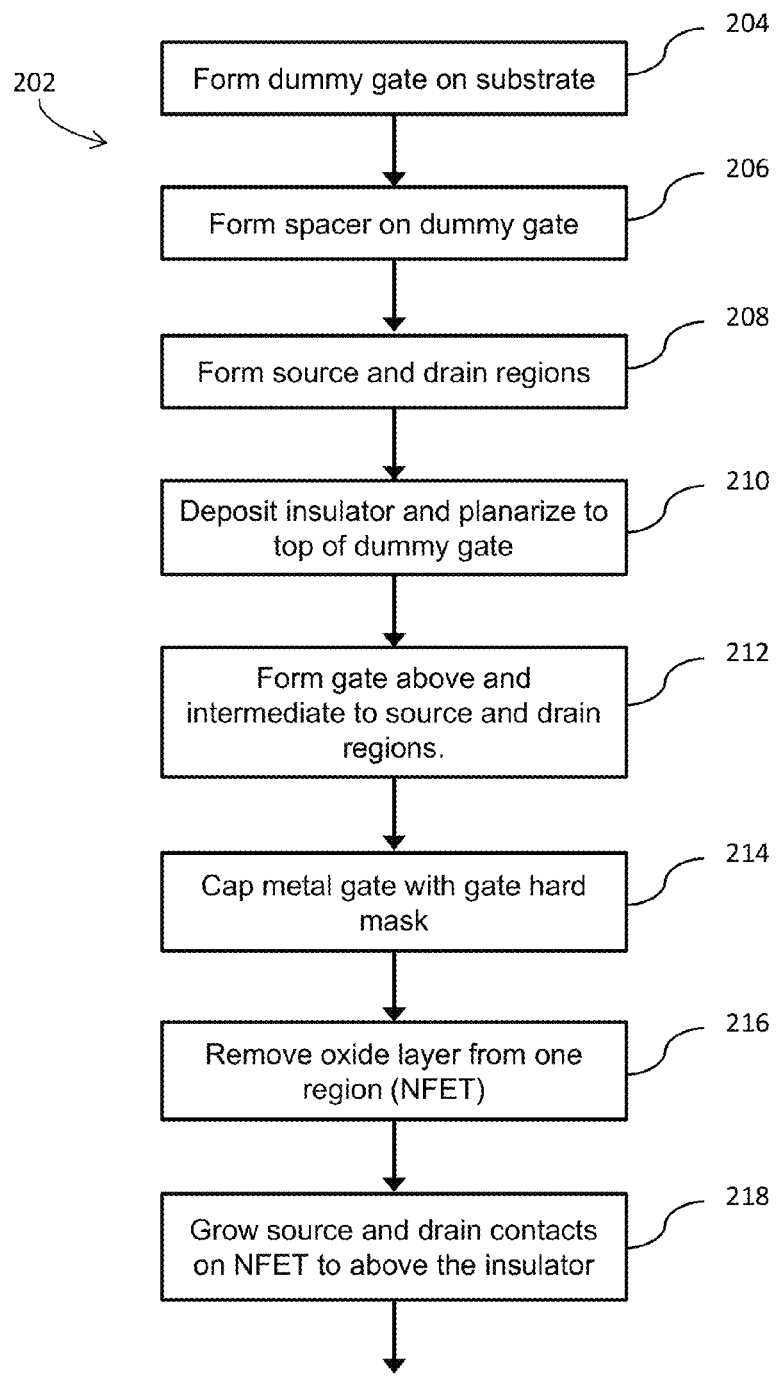
FIGS. 2A and 2B show an example process flow for fabricating a FET in accordance with the present invention.
Figure 2B:
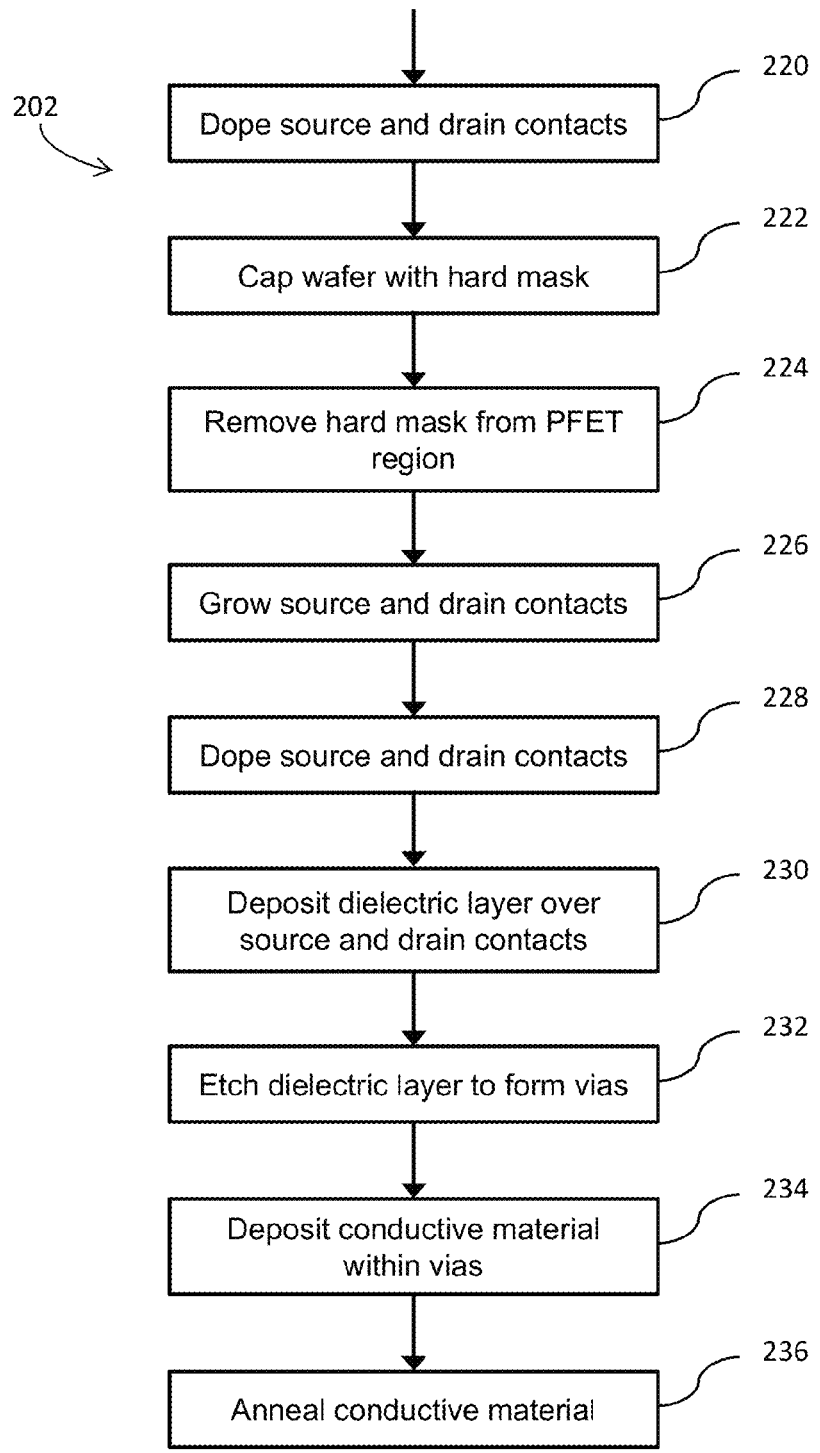
Figure 3:
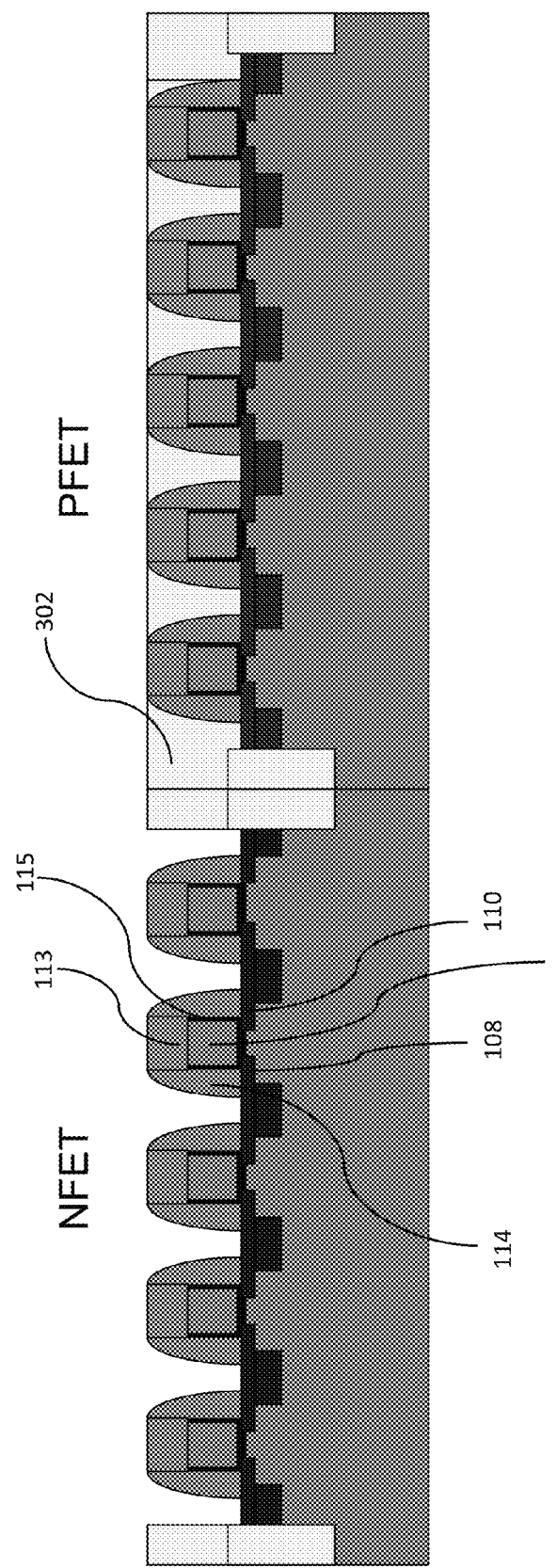
FIG. 3 shows an example CMOS wafer with a PFET array encapsulated in an oxide layer over and an NFET array with gate spacers exposed.

FIGS. 2A and 2B show an example process flow 202 for fabricating a FET in accordance with the present invention. The process flow 202 includes forming step 204. During this step dummy gates are formed on the substrate. After forming step 204 is completed, process flow continues to forming step 206.

At forming step 206, gate spacers are formed over the source and drain regions proximate the dummy gate. The gate spacers include a gate spacer height. After forming step 206 is completed, process flow continues to forming step 208.

At forming step 208, a source region and a drain region are formed in the substrate. It is contemplated that the source and drain region may be doped by N-type dopant material to form N-channel FETs, or P-type dopant material to form a P-channel FETs. The source and drain regions may be formed epitaxially or by implanting the substrate with dopant. After forming step 208 is completed, process flow continues to depositing step 210.

At depositing step 210, an insulator layer is deposited on top of the dummy gate. In one embodiment, the insulator in an oxide material. Depositing step 210 may include planarizing the insulator layer. After depositing step 210 is completed, process flow continues to forming step 212.

At forming step 212, an electrically conductive gate is formed above and intermediate to the source and drain region. This step may include replacing the dummy gate with gate dielectric (high-k) and metal gate. In a particular embodiment, the gate is formed before epitaxially growing a source contact and a drain contact. After forming step 212 is completed, process flow continues to capping step 214.

At capping step 214, the metal gate is capped with a gate hard mask. In one embodiment, the gate hard mask is a nitride material. After capping step 214 is completed, process flow continues to removing step 216.

At removing step 216, an oxide layer is removed from the NFET region of the wafer to exposes the NFET gate spacers. Turing to FIG. 3, an example CMOS wafer is shown with a PFET array encapsulated in an oxide layer 302 over and an NFET array with gate spacers exposed. This structure includes the source regions 108, drain regions 110, metal gates 112, gate spacers 114, and gate high-k dielectrics 115. The source and drain regions may be, for example, doped epitaxially grown silicon or epitaxially grown silicon-carbon. For the NFET array, the dopant can be phosphorous. For the PFET array, the dopant can be boron. Returning to FIG. 2, after removing step 216 is completed, process flow continues to growing step 218.

At growing step 218, source and drain contacts (also referred to herein as first and second contacts) are epitaxially grown over the source and drain regions, respectively. The source contact makes contact with the source region and extends beyond the gate spacer height. The drain contact makes contact with the drain region and also extends beyond the gate spacer height.

In one embodiment, growing step 218 is performed at low temperature. The source and drain contacts may be, for example, doped epitaxially grown silicon or epitaxially grown silicon-carbon. For the NFET array, the source and drain contacts can be phosphorous doped silicon, phosphorous doped silicon-germanium, or phosphorous doped silicon-carbon. In a particular embodiment, the source and drain contacts are phosphorous doped epitaxial silicon, doped at a concentration of 1.5E20 atoms/cm3, and epitaxially grown at 600° C.

Figure 4:
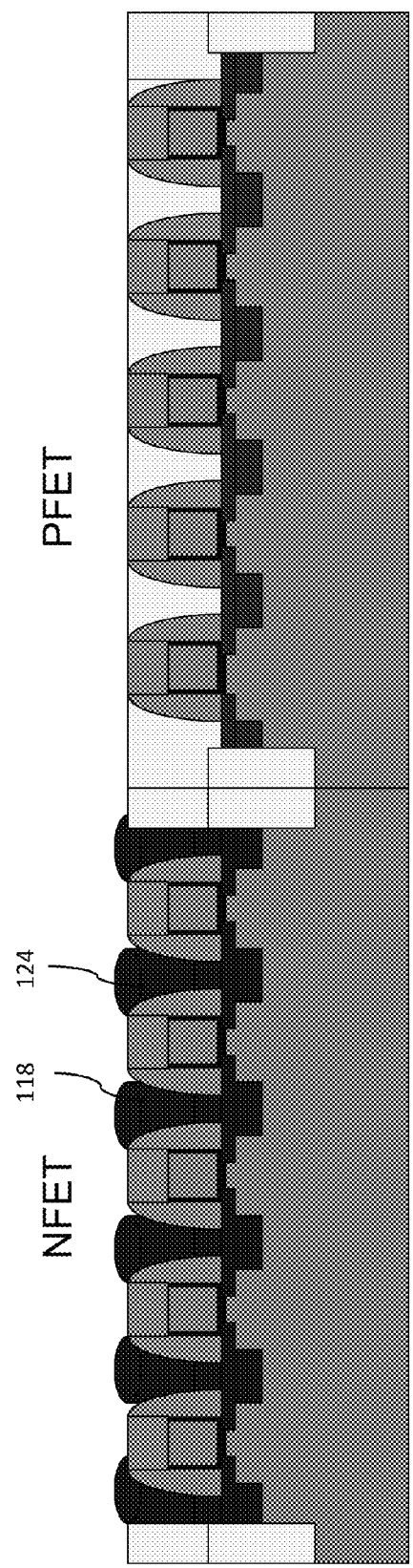
FIG. 4 shows source and drain contacts grown over the source and drain regions of the NFET array.

FIG. 4 shows source contacts 118 and drain contacts 124 grown over the source and drain regions of the NFET array. Each of the source and drain contacts includes a bottom contract area electrically coupled to the source region and the drain region at a first end and a top contract area at a second end opposite the first end. The top contract area is greater than the bottom contact area. Furthermore, the top contact area may include a protrusion that increases the top contact area.

Returning to FIG. 2, growing step 218 may include or be followed by doping step 220. During doping step 220, the source contact and the drain contact may be doped with either N-type dopant material or P-type dopant material. In one embodiment, the N-type dopant material is phosphorous and the P-type dopant material is boron. After doping step 220 is completed, process flow continues to capping step 222.

At capping step 222, the wafer is capped with a hard mask. In one embodiment, the hard mask is a nitride mask. After capping step 222 is completed, process flow continues to removing step 224.

At removing step 224, the hard mask is removed from PFET region of the wafer to exposes the PFET gate spacers. After removing step 224 is completed, process flow continues to growing step 226.

At growing step 226, source and drain contacts are epitaxially grown over the source and drain regions, respectively, of the PFET region. The source contact makes contact with the source region and extends beyond the gate spacer height. The drain contact makes contact with the drain region and also extends beyond the gate spacer height. Growing step 226 may include or be followed by doping step 228.

Figure 5:
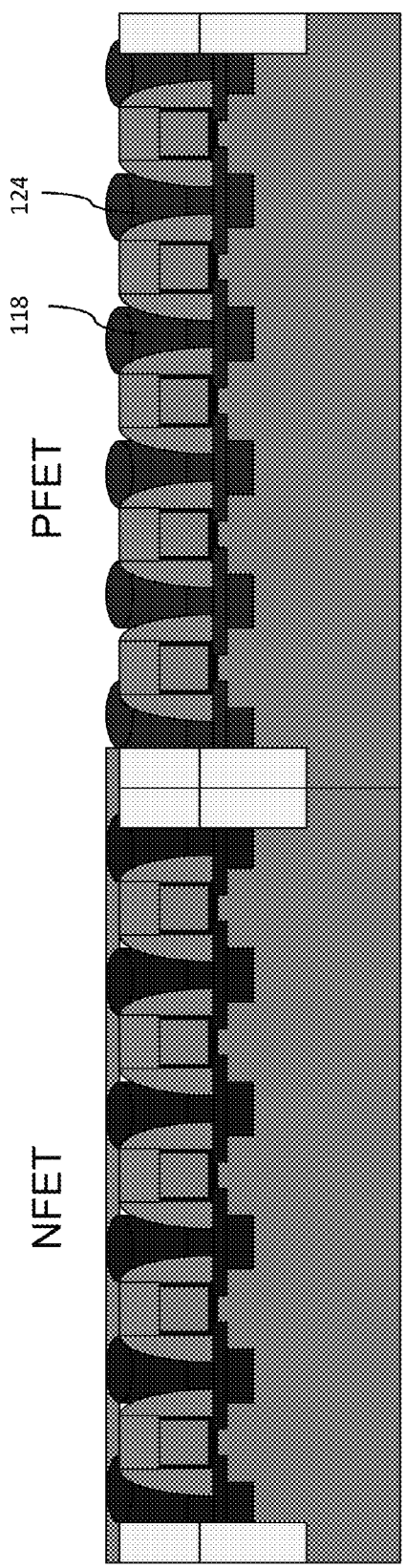
FIG. 5 shows source and drain contacts grown over the source and drain regions of the PFET array.

FIG. 5 shows source contacts 118 and drain contacts 124 grown over the source and drain regions of the PFET array. During this process, the oxide layer encapsulating the PFET array is removed and the NFET array is masked. In one embodiment, the source contacts 118 and drain contacts 124 can be constructed of boron doped silicon, boron doped silicon-germanium, or boron doped silicon-carbon. In a particular embodiment, the source and drain contacts are boron doped epitaxial silicon, doped at a concentration of 3E20 atoms/cm$^3$, and epitaxially grown at 600° C.

Returning to FIG. 2, doping step 228 is followed by depositing step 230. During depositing step 230, a dielectric layer is deposited over the source contact and the drain contact. In one embodiment of the invention, the dielectric layer is composed of silicon oxide. After depositing step 230 is completed, process flow continues to etching step 232.

Figure 6:
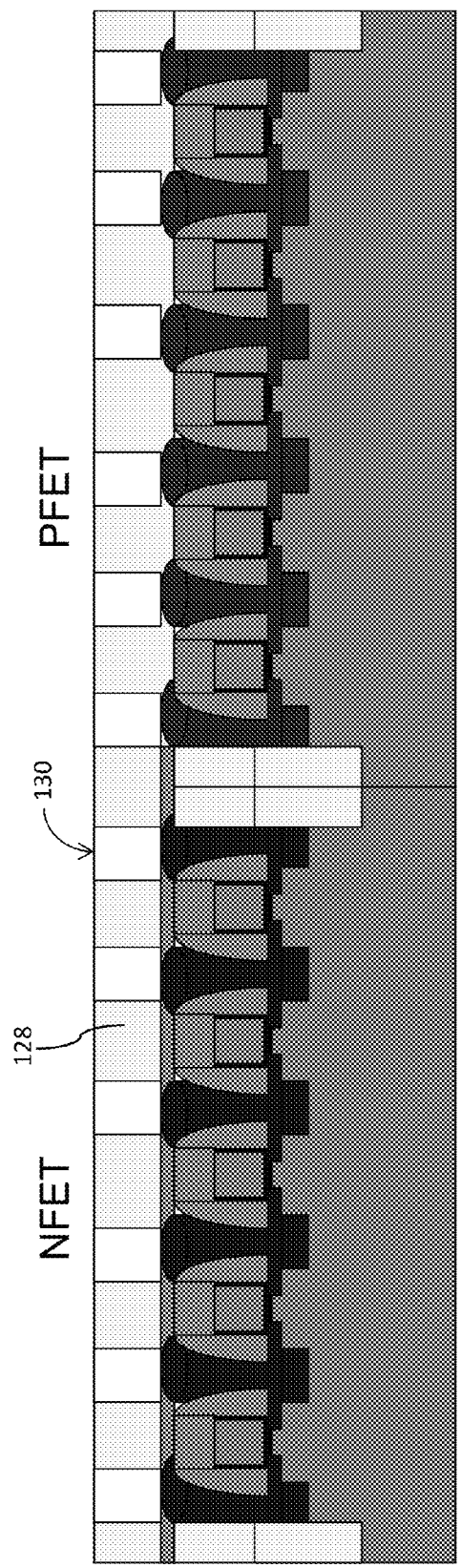
FIG. 6 shows a dielectric layer over the NFET and PFET arrays, with vias etched from the dielectric layer running down to the source and drain contacts.

At etching step 232, the dielectric layer is etched to form vias in the dielectric layer. The formed vias expose the source and drain contacts. FIG. 6 shows the dielectric layer over the NFET and PFET arrays, with vias 130 etched from the dielectric layer 128 running down to the source and drain contacts.

Returning to FIG. 2, etching step 232 is followed by depositing step 234. During depositing step 234, a conductive material is deposited within the vias. In one embodiment of the invention, the conductive material may be composed of cobalt, copper, nickel or tungsten. The depositing step 234 may be followed by or accompanied with annealing step 236. During the annealing step 236, the conductive material is annealed to form silicide at the top contract area.

Figure 7:
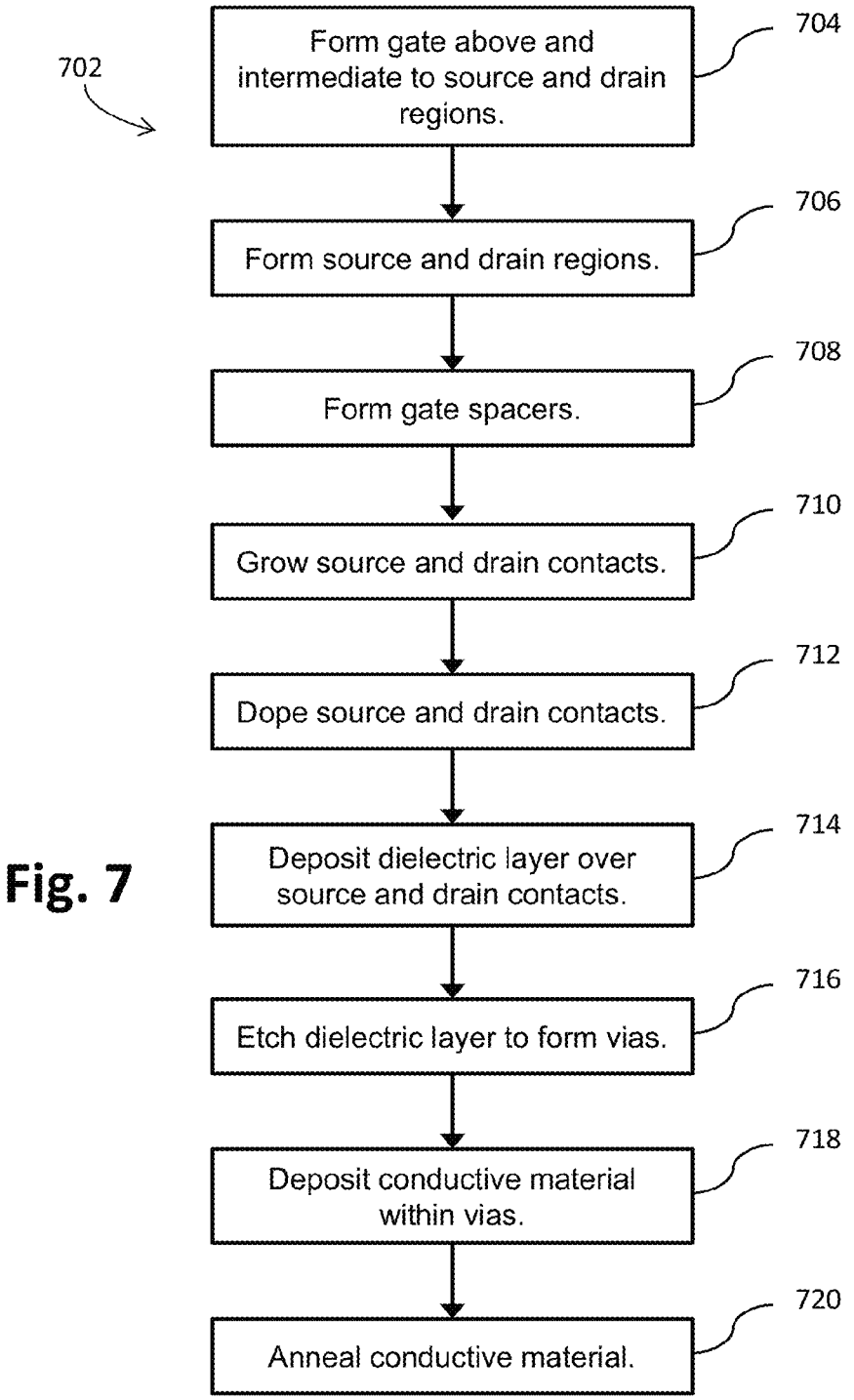
FIG. 7 shows an alternative example process flow for fabricating a FET in accordance with the present invention.

FIG. 7 shows an alternative example process flow 702 for fabricating a FET in accordance with the present invention. The process flow 702 represents a gate-first process flow incorporating the present invention, rather than a gate last or dummy gate process flow described above. The process flow 702 includes forming step 704. During this step an electrically conductive gate is formed above and intermediate to source and drain regions. In a particular embodiment, the gate is formed before epitaxially growing a source contact and a drain contact. After forming step 704 is completed, process flow continues to forming step 706.

At forming step 706, a source region and a drain region are formed in the substrate. It is contemplated that the source and drain region may be doped by N-type dopant material to form N-channel FETs, or P-type dopant material to form a P-channel FETs. After forming step 706 is completed, process flow continues to forming step 708.

At forming step 708, gate spacers are formed over the source and drain regions. The gate spacers include a gate spacer height. After forming step 708 is completed, process flow continues to growing step 710.

At growing step 710, source and drain contacts are epitaxially grown over the source and drain regions, respectively. The source contact makes contact with the source region and extends beyond the gate spacer height. The drain contact makes contact with the drain region and also extends beyond the gate spacer height.

In one embodiment, growing step 710 is performed at low temperature. The source and drain contacts may be, for example, doped epitaxially grown silicon or epitaxially grown silicon-carbon. For the NFET array, the source and drain contacts can be phosphorous doped silicon, phosphorous doped silicon-germanium, or phosphorous doped silicon-carbon. In a particular embodiment, the source and drain contacts are phosphorous doped epitaxial silicon, doped at a concentration of $1.5E20$ atoms/cm$^3$, and epitaxially grown at 600° C.

Growing step 710 may include or be followed by doping step 712. During doping step 708, the source contact and the drain contact may be doped with either N-type dopant material or P-type dopant material. In one embodiment, the N-type dopant material is phosphorous and the P-type dopant material is boron.

Doping step 712 is followed by depositing step 714. During depositing step 714, a dielectric layer is deposited over the source contact and the drain contact. In one embodiment of the invention, the dielectric layer is composed of silicon oxide. After depositing step 714 is completed, process flow continues to etching step 716.

At etching step 716, the dielectric layer is etched to form vias in the dielectric layer. The formed vias expose the source and drain contacts. After etching step 714 is completed, process flow continues to depositing step 718.

During depositing step 718, a conductive material is deposited within the vias. In one embodiment of the invention, the conductive material may be composed of cobalt, copper, nickel or tungsten. The depositing step 718 may be followed by or accompanied with annealing step 720. During the annealing step 720, the conductive material is annealed to form silicide at the top contract area.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for constructing a field-effect transistor (FET), the method comprising:
    forming a source region and a drain region in a substrate;
    forming gate spacers over the source region and the drain region, the gate spacers including a gate spacer height;
    epitaxially growing a source contact and a drain contact, the source contact contacting the source region and extending beyond the gate spacer height, the drain contact contacting the drain region and extending beyond the gate spacer height;
    forming an electrically conductive gate above and intermediate to the source region and the drain region; and
    wherein the gate is formed after epitaxially growing the source contact and the drain contact.

2. The method of claim 1, further comprising:
    wherein each of the source contact and the drain contact includes a bottom contract area at a first end, the bottom contact area electrically coupled to the source region and the drain region;
    wherein each of the source contact and the drain contact includes a top contract area at a second end opposite the first end; and
    wherein the top contract area is greater than the bottom contact area.

3. The method of claim 1, further comprising doping the source contact and the drain contact with N-type dopant material.

4. The method of claim 1, further comprising doping the source contact and the drain contact with P-type dopant material.

5. A method for constructing a field-effect transistor (FET), the method comprising:
    forming a source region and a drain region in a substrate;
    forming gate spacers over the source region and the drain region, the gate spacers including a gate spacer height;
    epitaxially growing a source contact and a drain contact, the source contact contacting the source region and extending beyond the gate spacer height, the drain contact contacting the drain region and extending beyond the gate spacer height;
    depositing a dielectric layer over the source contact and the drain contact; and
    etching the dielectric layer to form vias in the dielectric layer, the vias exposing the source contact and the drain contact;
    depositing a conductive material within the vias; and
    annealing the conductive material to form silicide at the top contract area.

6. The method of claim 5, further comprising forming an electrically conductive gate above and intermediate to the source region and the drain region.

7. The method of claim 6, wherein the gate is formed before epitaxially growing the source contact and the drain contact.

8. The method of claim 6, wherein the gate is formed after epitaxially growing the source contact and the drain contact.

9. The method of claim 5, further comprising:
    wherein each of the source contact and the drain contact includes a bottom contract area at a first end, the bottom contact area electrically coupled to the source region and the drain region;
    wherein each of the source contact and the drain contact includes a top contract area at a second end opposite the first end; and
    wherein the top contract area is greater than the bottom contact area.

10. The method of claim 5, further comprising doping the source contact and the drain contact with N-type dopant material.

11. The method of claim 5, further comprising doping the source contact and the drain contact with P-type dopant material.

12. A method for constructing a field-effect transistor (FET), the method comprising:
- forming a source region and a drain region in a substrate;
- forming gate spacers over the source region and the drain region, the gate spacers including a gate spacer height;
- epitaxially growing a source contact and a drain contact, the source contact contacting the source region and extending beyond the gate spacer height, the drain contact contacting the drain region and extending beyond the gate spacer height;
- forming an electrically conductive gate above and intermediate to the source region and the drain region;
- depositing a dielectric layer over the conductive gate, the source contact and the drain contact; and
- etching the dielectric layer to form vias in the dielectric layer, the vias exposing the source contact and the drain contact;
- depositing a conductive material within the vias; and
- annealing the conductive material to form silicide at a top contract area;
- wherein each of the source contact and the drain contact includes a bottom contract area at a first end, the bottom contact area electrically coupled to the source region and the drain region;
- wherein each of the source contact and the drain contact includes the top contract area at a second end opposite the first end; and
- wherein the top contract area is greater than the bottom contact area.

13. The method of claim 12, further comprising forming an electrically conductive gate above and intermediate to the source region and the drain region.

14. The method of claim 13, wherein the gate is formed before epitaxially growing the source contact and the drain contact.

15. The method of claim 13, wherein the gate is formed after epitaxially growing the source contact and the drain contact.

16. The method of claim 12, further comprising doping the source contact and the drain contact with N-type dopant material.

17. The method of claim 12, further comprising doping the source contact and the drain contact with P-type dopant material.

* * * * *